(12) United States Patent
Nishimura et al.

(10) Patent No.: US 7,969,690 B2
(45) Date of Patent: Jun. 28, 2011

(54) TUNNELING MAGNETORESISTIVE ELEMENT WHICH INCLUDES MG-O BARRIER LAYER AND IN WHICH NONMAGNETIC METAL SUBLAYER IS DISPOSED IN ONE OF MAGNETIC LAYERS

(75) Inventors: Kazumasa Nishimura, Niigata-ken (JP); Masamichi Saito, Niigata-ken (JP); Yosuke Ide, Niigata-ken (JP); Ryo Nakabayashi, Niigata-ken (JP); Yoshihiro Nishiyama, Niigata-ken (JP); Hidekazu Kobayashi, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 677 days.

(21) Appl. No.: 12/042,585

(22) Filed: Mar. 5, 2008

(65) Prior Publication Data
US 2008/0218913 A1 Sep. 11, 2008

(30) Foreign Application Priority Data

Mar. 5, 2007 (JP) .................................. 2007-054439

(51) Int. Cl.
*G11B 5/39* (2006.01)
(52) U.S. Cl. .................................................... 360/313
(58) Field of Classification Search .................... 360/313
See application file for complete search history.

(56) References Cited

U.S. PATENT DOCUMENTS

| 7,443,639 | B2 * | 10/2008 | Parkin | 360/324.2 |
| 7,760,474 | B1 * | 7/2010 | Huai et al. | 360/324.12 |
| 7,764,468 | B2 * | 7/2010 | Sawada et al. | 360/313 |
| 7,800,868 | B2 * | 9/2010 | Gao et al. | 360/324.12 |
| 7,821,747 | B2 * | 10/2010 | Gill | 360/324.2 |

FOREIGN PATENT DOCUMENTS

| JP | 2000-020926 | 1/2000 |
| JP | 2001-352112 | 12/2001 |
| JP | 2003-298142 | 10/2003 |
| JP | 2005-203790 | 7/2005 |
| JP | 2005-260226 | 9/2005 |
| JP | 2005-277214 | 10/2005 |
| JP | 2005-286340 | 10/2005 |

* cited by examiner

*Primary Examiner* — Mark Blouin
(74) *Attorney, Agent, or Firm* — Brinks Hofer Gilson & Lione (57) ABSTRACT

In a tunneling magnetoresistive element, an insulating barrier layer is made of Mg—O, and a first pinned magnetic layer has a laminated structure in which a nonmagnetic metal sublayer made of Ta is interposed between a lower ferromagnetic sublayer and an upper ferromagnetic sublayer. The nonmagnetic metal sublayer has an average thickness of about 1 Å or more and about 5 Å or less.

5 Claims, 6 Drawing Sheets

FIG. 8
△ : CoFe(12)/Ta(x)/CoFe(12) EXAMPLE 1
□ : CoFe(10)/Ta(y)/CoFe(10) EXAMPLE 1
● : CoFe(12)/Ta(3)/CoFe(12) EXAMPLE 2
■ : CoFe(20) COMPARATIVE EXAMPLE

FIG. 9
△ : CoFe(12)/Ta(x)/CoFe(12) EXAMPLE 1
□ : CoFe(10)/Ta(y)/CoFe(10) EXAMPLE 1
■ : CoFe(20) COMPARATIVE EXAMPLE

TUNNELING MAGNETORESISTIVE ELEMENT WHICH INCLUDES MG-O BARRIER LAYER AND IN WHICH NONMAGNETIC METAL SUBLAYER IS DISPOSED IN ONE OF MAGNETIC LAYERS

CLAIM FOR PRIORITY

This application claims benefit of the Japanese Patent Application No. 2007-054439 filed on Mar. 5, 2007, which is hereby incorporated in its entirety by reference.

BACKGROUND

1. Field of the Invention

The present invention relates to a magnetoresistive element that is installed in, for example, a hard disk device or other magnetoresistive device and that utilizes a tunnel effect, and in particular, to a tunneling magnetoresistive element in which a ratio of change in resistance ($\Delta R/R$) can be increased while a small RA (element resistance R×element area A) is realized.

2. Description of the Related Art

Tunneling magnetoresistive (TMR) elements (i.e., tunnel type magnetic sensing elements) are elements whose resistance changes by utilizing a tunnel effect. In such TMR elements, when the magnetization of a pinned magnetic layer and the magnetization of a free magnetic layer are antiparallel, a tunneling current does not easily flow through an insulating barrier layer (tunnel barrier layer) provided between the pinned magnetic layer and the free magnetic layer, and thus, the resistance becomes maximum. In contrast, when the magnetization of the pinned magnetic layer and the magnetization of the free magnetic layer are parallel, the tunneling current flows most easily, and thus, the resistance becomes minimum.

By utilizing this principle, a leakage magnetic field from a recording medium is detected as a change in the voltage based on a change in the electrical resistance, which changes in accordance with a change in the magnetization of the free magnetic layer in response to an external magnetic field. Examples of the related art include Japanese Unexamined Patent Application Publication Nos. 2005-286340 and 2005-260226.

Hitherto, a tunneling magnetoresistive element having a small RA (element resistance R×element area A) and a high ratio of change in resistance ($\Delta R/R$) has not been realized. In general, as the RA decreases, the ratio of change in resistance ($\Delta R/R$) also decreases.

From the standpoint of an effective improvement in the ratio of change in resistance ($\Delta R/R$), in a tunneling magnetoresistive element including an insulating barrier layer made of magnesium oxide (Mg—O), it is believed that the insulating barrier layer, a part of a pinned magnetic layer, and a part of a free magnetic layer, the parts being in contact at the interface with the insulating barrier layer, are preferably formed as a body-centered cubic structure (bcc structure) in which equivalent crystal planes that are typically represented as {100} planes are preferentially oriented on the plane parallel to the layer surfaces.

However, hitherto, in such a tunneling magnetoresistive element including an insulating barrier layer made of Mg—O, a high ratio of change in resistance ($\Delta R/R$) has not been appropriately realized within a range of a small RA.

The inventions disclosed in Japanese Unexamined Patent Application Publication Nos. 2005-286340 and 2005-260226 neither consider the above-described problems nor describe means for solving the problems.

SUMMARY

A tunneling magnetoresistive element includes a lower magnetic layer, an insulating barrier layer laminated on the lower magnetic layer, and an upper magnetic layer laminated on the insulating barrier layer. In one of the lower magnetic layer and the upper magnetic layer is a pinned magnetic layer in which the magnetization direction is pinned and the other is a free magnetic layer in which the magnetization direction is changed in response to an external magnetic field. In the tunneling magnetoresistive element, the insulating barrier layer is made of magnesium oxide (Mg—O), the lower magnetic layer has a laminated ferrimagnetic structure in which, from the bottom, a first magnetic layer, a nonmagnetic interlayer, and a second magnetic layer are laminated in that order. Furthermore, the first magnetic layer has a laminated structure in which at least one nonmagnetic metal sublayer is interposed between ferromagnetic sublayers, the ferromagnetic sublayers are magnetically coupled to each other, and all the ferromagnetic sublayers are magnetized in the same direction.

According to the above structure of the present invention, the ratio of change in resistance ($\Delta R/R$) can be increased while a small RA is realized.

DESCRIPTION OF THE EMBODIMENTS

Figure 1:
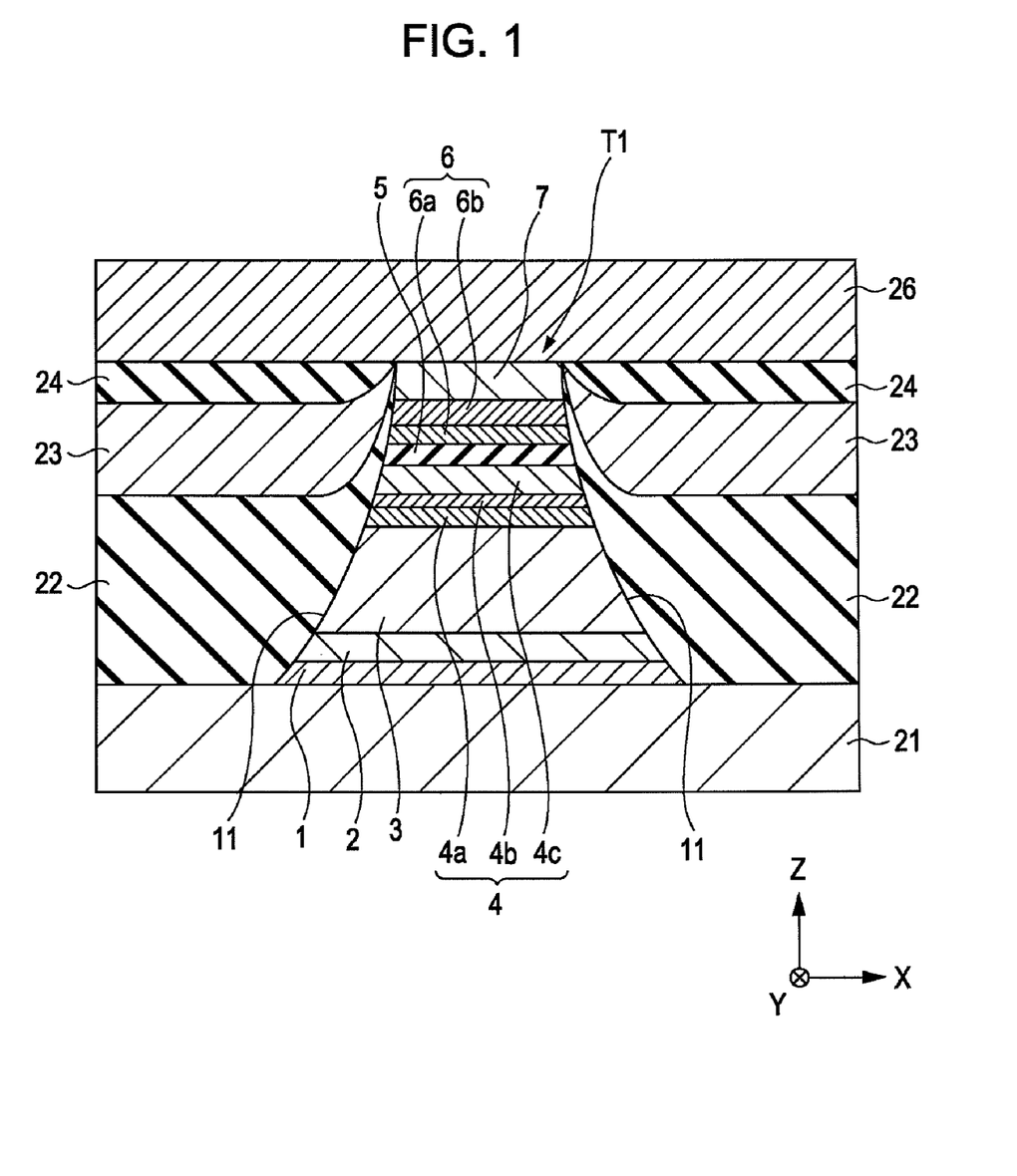
FIG. 1 is a cross-sectional view of a tunneling magnetoresistive element cut along a face parallel to a surface facing a recording medium.

FIG. 1 is a cross-sectional view of a tunneling magnetoresistive element according to an embodiment cut along a face parallel to a surface facing a recording medium.

The tunneling magnetoresistive element is mounted, for example, at the trailing edge of a floating slider installed in a hard disk device to detect leakage magnetic fields (recording magnetic fields) from the magnetic recording medium. In figures, the X direction represents a track width direction, the Y direction is the direction of the leakage magnetic field from the magnetic recording medium (height direction), and the Z direction is the moving direction of the magnetic recording medium and the stacking direction of layers of the tunneling magnetoresistive element.

Referring to FIG. 1, a lower shield layer 21 made of, for example, a Ni—Fe alloy is provided at the bottom. A laminate T1 is provided on the lower shield layer 21. The tunneling magnetoresistive element is composed of the laminate T1; a lower insulating layer 22, a hard bias layer 23, and an upper insulating layer 24, all of which are provided at both sides of the laminate T1 in the track width direction (the X direction in the figure).

A base layer 1 made of at least one nonmagnetic element selected from tantalum (Ta), hafnium (Hf), niobium (Nb), zirconium (Zr), titanium (Ti), molybdenum (Mo), and tungsten (W) is provided as a bottom layer of the laminate T1. A seed layer 2 is provided on the base later 1. The seed layer 2 is made of, for example, a nickel-iron-chromium (Ni—Fe—Cr) alloy, chromium (Cr), or ruthenium (Ru). The seed layer 2 may have a single-layer structure or a laminated structure including a plurality of layers made of different materials. The base layer 1 is not necessarily formed.

A base layer 1 made of at least one nonmagnetic element selected from tantalum (Ta), hafnium (Hf), niobium (Nb), zirconium (Zr), titanium (Ti), molybdenum (Mo), and tungsten (W) is provided as a bottom layer of the laminate T1. A seed layer 2 is provided on the base later 1. The seed layer 2 is made of, for example, a nickel-iron-chromium (Ni—Fe—Cr) alloy, chromium (Cr), or ruthenium (Ru). The seed layer 2 may have a single-layer structure or a laminated structure including a plurality of layers made of different materials. The base layer 1 is not necessarily formed.

An antiferromagnetic layer 3 provided on the seed layer 2 is preferably made of an antiferromagnetic material containing X and manganese (Mn), wherein X is at least one element selected from platinum (Pt), palladium (Pd), iridium (Ir), rhodium (Rh), ruthenium (Ru), and osmium (Os).

The antiferromagnetic layer 3 may be made of an antiferromagnetic material containing X, X', and Mn, wherein X' is at least one element selected from neon (Ne), argon (Ar), krypton (Kr), xenon (Xe), beryllium (Be), boron (B), carbon (C), nitrogen (N), magnesium (Mg), aluminum (Al), silicon (Si), phosphorus (P), titanium (Ti), vanadium (V), chromium (Cr), iron (Fe), cobalt (Co), nickel (Ni), copper (Cu), zinc (Zn), gallium (Ga), germanium (Ge), zirconium (Zr), niobium (Nb), molybdenum (Mo), silver (Ag), cadmium (Cd), tin (Sn), hafnium (Hf), tantalum (Ta), tungsten (W), rhenium (Re), gold (Au), lead (Pb), and rare earth elements.

The antiferromagnetic layer 3 is made of, for example, an Ir—Mn alloy.

A pinned magnetic layer (lower magnetic layer) 4 is provided on the antiferromagnetic layer 3. The pinned magnetic layer 4 has a laminated ferrimagnetic structure in which a first pinned magnetic layer (first magnetic layer) 4a, a nonmagnetic interlayer 4b, and a second pinned magnetic layer (second magnetic layer) 4c are laminated from the bottom in that order. The first pinned magnetic layer 4a is magnetized in the direction antiparallel to the magnetization direction of the second pinned magnetic layer 4c by the exchange coupling magnetic field generated at the interface between the pinned magnetic layer 4 and the antiferromagnetic layer 3 and by the antiferromagnetic exchange coupling magnetic field (Ruderman-Kittel-Kasuya-Yosida interaction, i.e., RKKY interaction) through the nonmagnetic interlayer 4b. By forming the pinned magnetic layer 4 having a laminated ferrimagnetic structure, the magnetized state of the pinned magnetic layer 4 can be stabilized. In addition, the exchange coupling magnetic field generated at the interface between the pinned magnetic layer 4 and the antiferromagnetic layer 3 can be apparently increased. Each of the first pinned magnetic layer 4a and the second pinned magnetic layer 4c is formed so as to have a thickness in the range of about 12 to 40 Å. The nonmagnetic interlayer 4b is formed so as to have a thickness in the range of about 8 to 10 Å.

The second pinned magnetic layer 4c is made of, for example, $(Co_{100-\alpha}Fe_{\alpha})_{\beta}B_{100-\beta}$ and is formed so as to have an atomic ratio $\alpha$ in the range of about 25 to about 100 and a composition ratio $\beta$ in the range of about 70 to about 90 atomic percent.

The nonmagnetic interlayer 4b is made of a nonmagnetic conductive material such as ruthenium (Ru), rhodium (Rh), iridium (Ir), chromium (Cr), rhenium (Re), or copper (Cu).

An insulating barrier layer 5 provided on the pinned magnetic layer 4 is made of magnesium oxide (Mg—O). The composition ratio of magnesium in Mg—O is preferably in the range of about 40 to about 60 atomic percent, and most preferably, $Mg_{50at\%}O_{50at\%}$.

A magnesium (Mg) layer having a very small thickness (e.g., in the range of about 1 to about 6 Å) may be provided between the insulating barrier layer 5 and the second pinned magnetic layer 4c.

A free magnetic layer (upper magnetic layer) 6 is provided on the insulating barrier layer 5. The free magnetic layer 6 includes a soft magnetic layer 6b made of a magnetic material, such as a nickel-iron (Ni—Fe) alloy, and an enhance layer 6a that is made of, for example, a cobalt-iron (Co—Fe) alloy and that is provided between the soft magnetic layer 6b and the insulating barrier layer 5. The soft magnetic layer 6b is preferably made of a magnetic material having excellent soft magnetic properties. The enhance layer 6a is preferably made of a magnetic material having a spin polarizability higher than that of the soft magnetic layer 6b. By forming the enhance layer 6a made of a Co—Fe alloy, which has a high spin polarizability, the ratio of change in resistance ($\Delta R/R$) can be improved.

The free magnetic layer 6 may have a laminated ferrimagnetic structure in which a plurality of magnetic layers are laminated, with at least one nonmagnetic interlayer therebetween. The width dimension of the free magnetic layer 6 in the track width direction (the X direction in the figure) determines a track width Tw.

A protective layer 7 made of, for example, tantalum (Ta) is provided on the free magnetic layer 6.

End faces 11 of the laminate T1 at both sides in the track width direction (the X direction in the figure) form inclined surfaces so that the width dimension in the track width direction tapers upward.

As shown in FIG. 1, the lower insulating layer 22 is provided so as to cover the lower shield layer 21 and the end faces 11 of the laminate T1, which extend at both sides of the laminate T1. The hard bias layer 23 is provided on the lower insulating layer 22, and furthermore, the upper insulating layer 24 is provided on the hard bias layer 23.

A bias underlayer (not shown) may be provided between the lower insulating layer 22 and the hard bias layer 23. The bias underlayer is made of, for example, chromium (Cr), tungsten (W), or titanium (Ti).

Each of the lower insulating layer 22 and the upper insulating layer 24 is made of an insulating material such as $Al_2O_3$ or $SiO_2$. These insulating layers 22 and 24 insulate the upper part and the lower part of the hard bias layer 23 in order to prevent a current flowing in the laminate T1 in a direction perpendicular to the interfaces of the layers from separately flowing to both sides of the laminate T1 in the track width direction. The hard bias layer 23 is made of, for example, a cobalt-platinum (Co—Pt) alloy or a cobalt-chromium-platinum (Co—Cr—Pt) alloy.

An upper shield layer 26 made of, for example, a Ni—Fe alloy is provided on the laminate T1 and the upper insulating layer 24.

In the embodiment shown in FIG. 1, the lower shield layer 21 and the upper shield layer 26 function as electrode layers for the laminate T1, and a current flows in a direction perpendicular to the surfaces of the layers constituting the laminate T1 (in a direction parallel to the Z direction in the figure).

The free magnetic layer 6 is magnetized in a direction parallel to the track width direction (the X direction in the figure) by a bias magnetic field from the hard bias layers 23. On the other hand, the first pinned magnetic layer 4a and the second pinned magnetic layer 4c of the pinned magnetic layer 4 are magnetized in directions parallel to the height direction (the Y direction in the figure). Since the pinned magnetic layer 4 has a laminated ferrimagnetic structure, the first pinned magnetic layer 4a is magnetized in the direction antiparallel to the magnetization direction of the second pinned magnetic layer 4c. The magnetization of the pinned magnetic layer 4 is pinned (i.e., the magnetization of the pinned magnetic layer 4 is not changed in response to an external magnetic field), but the magnetization of the free magnetic layer 6 is changed in response to an external magnetic field.

When the magnetization of the free magnetic layer 6 is changed in response to an external magnetic field, in the case where the magnetization of the second pinned magnetic layer 4c and the magnetization of the free magnetic layer 6 are antiparallel, a tunneling current does not easily flow through the insulating barrier layer 5 provided between the second pinned magnetic layer 4c and the free magnetic layer 6, and thus, the resistance becomes maximum. In contrast, in the case where the magnetization of the second pinned magnetic layer 4c and the magnetization of the free magnetic layer 6 are parallel, the tunneling current flows most easily, and thus, the resistance becomes minimum.

By utilizing this principle, a leakage magnetic field from the recording medium is detected as a change in the voltage based on a change in the electrical resistance, which changes in accordance with a change in the magnetization of the free magnetic layer 6 in response to an external magnetic field.

Figure 2:
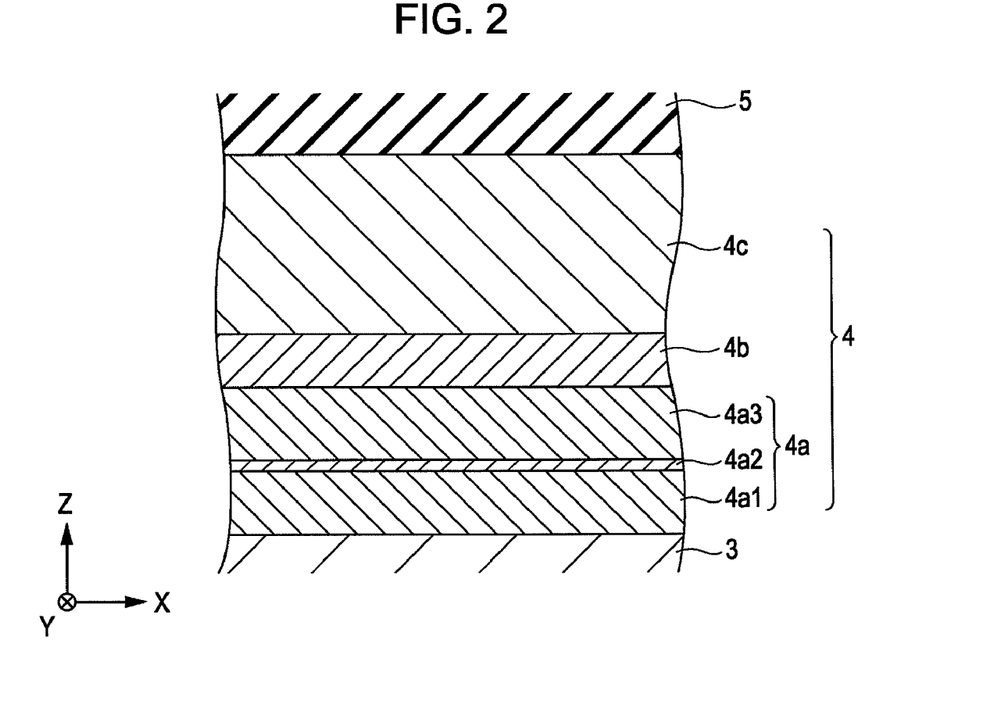
FIG. 2 is a partial enlarged cross-sectional view of FIG. 1, showing the structure of a pinned magnetic layer according to an embodiment.

Features of the tunneling magnetoresistive element of this embodiment will now be described. FIG. 2 is a partial enlarged cross-sectional view of the pinned magnetic layer 4 of the tunneling magnetoresistive element shown in FIG. 1.

As shown in FIG. 2, the first pinned magnetic layer 4a is formed by sequentially laminating, from the bottom, a lower ferromagnetic sublayer 4a1, a nonmagnetic metal sublayer 4a2, and an upper ferromagnetic sublayer 4a3. The nonmagnetic metal sublayer 4a2 is formed so as to have a small average thickness. The lower ferromagnetic sublayer 4a1 and the upper ferromagnetic sublayer 4a3 are magnetically coupled. The magnetization of the lower ferromagnetic sublayer 4a1 and the magnetization of the upper ferromagnetic sublayer 4a3 are pinned in the same direction. For example, both the magnetization of the lower ferromagnetic sublayer 4a1 and the magnetization of the upper ferromagnetic sublayer 4a3 are pinned in the Y direction in the figure. In this case, the magnetization of the second pinned magnetic layer 4c is pinned in the direction opposite to the Y direction in the figure.

The average thickness of the nonmagnetic metal sublayer 4a2 is preferably about 1 Å or more and about 5 Å or less. When the average thickness of the nonmagnetic metal sublayer 4a2 is less than about 1 Å, an effect of increasing the ratio of change in resistance ($\Delta R/R$) cannot be achieved. On the other hand, when the average thickness of the nonmagnetic metal sublayer 4a2 is more than about 5 Å, the magnetic coupling between the lower ferromagnetic sublayer 4a1 and the upper ferromagnetic sublayer 4a3 is easily broken, thus causing degradations of the reproducing characteristics such as the generation of noise and the degradation of the ratio of change in resistance ($\Delta R/R$). Accordingly, in this embodiment, the average thickness of the nonmagnetic metal sublayer 4a2 is preferably about 1 Å or more and about 5 Å or less. The average thickness of the nonmagnetic metal sublayer 4a2 is more preferably about 2 Å or more and about 4 Å or less.

As described above, the average thickness of the nonmagnetic metal sublayer 4a2 is very small. Therefore, the nonmagnetic metal sublayer 4a2 need not be formed so as to have a uniform thickness, as shown in FIG. 2. Alternatively, the nonmagnetic metal sublayer 4a2 may be discontinuously formed on the lower ferromagnetic sublayer 4a1. When the nonmagnetic metal sublayer 4a2 is discontinuously formed, the magnetic coupling force (ferromagnetic coupling) between the lower ferromagnetic sublayer 4a1 and the upper ferromagnetic sublayer 4a3 can be further increased. The term "average thickness of the nonmagnetic metal sublayer 4a2" means a film thickness obtained when the thickness of the nonmagnetic metal sublayer 4a2 is averaged over the entire surface of the lower ferromagnetic sublayer 4a1. Therefore, when the nonmagnetic metal sublayer 4a2 is discontinuously formed on the lower ferromagnetic sublayer 4a1, the "average thickness" is determined considering areas (pinholes) where the nonmagnetic metal sublayer 4a2 is not provided on the lower ferromagnetic sublayer 4a1.

The nonmagnetic metal sublayer 4a2 is preferably made of at least one of titanium (Ti), vanadium (V), zirconium (Zr), niobium (Nb), molybdenum (Mo), hafnium (Hf), tantalum (Ta), and tungsten (W). The nonmagnetic metal sublayer 4a2 is more preferably made of tantalum (Ta).

In this embodiment, the insulating barrier layer 5 is made of Mg—O, and the first pinned magnetic layer 4a has a structure in which the nonmagnetic metal sublayer 4a2 made of, for example, Ta is disposed between the two ferromagnetic sublayers 4a1 and 4a3. As a result, the ratio of change in resistance ($\Delta R/R$) can be effectively increased while a small RA can be realized, compared with known structures. The value of RA is preferably in the range of about 1.0 to about 5.0 $\Omega \cdot \mu m^2$.

The reasons of an increase in the ratio of change in resistance ($\Delta R/R$) are believed to be as follows: First, after an annealing treatment, in the second pinned magnetic layer 4c, the insulating barrier layer 5, and the enhance layer 6a, equivalent crystal planes of a body-centered cubic structure (bcc structure) that are typically represented as {100} planes are preferentially oriented on a plane (the X-Y plane in the figure) parallel to the layer surfaces. Secondly, during the annealing treatment, diffusion of Mn contained in the antiferromagnetic layer 3 into layers disposed on and above the nonmagnetic metal sublayer 4a2 is appropriately suppressed. Thirdly, the flatness of layers formed on and above the nonmagnetic metal sublayer 4a2, in particular, the flatness at the interface between the second pinned magnetic layer 4c and the insulating barrier layer 5 is improved.

In this embodiment, the pinned magnetic layer 4 has a laminated ferrimagnetic structure, and the nonmagnetic metal sublayer 4a2 is disposed in the first pinned magnetic layer 4a adjacent to the antiferromagnetic layer 3. The laminated ferrimagnetic structure can increase the magnetization-pinning force of the pinned magnetic layer 4 and appropriately improve the ratio of change in resistance (ΔR/R). In this laminated ferrimagnetic structure, the second pinned magnetic layer 4c has the same structure as a known structure. The second pinned magnetic layer 4c is a layer that is adjacent to the insulating barrier layer 5 and that directly contributes to the ratio of change in resistance (ΔR/R). Therefore, the material or the structure of the second pinned magnetic layer 4c is not changed, and instead, the structure of the first pinned magnetic layer 4a is improved, thus, for example, improving the crystal structure near the insulating barrier layer 5. Consequently, the ratio of change in resistance (ΔR/R) can be more effectively improved.

The lower ferromagnetic sublayer 4a1 and the upper ferromagnetic sublayer 4a3 may be made of the same ferromagnetic material or different ferromagnetic materials. For example, both the lower ferromagnetic sublayer 4a1 and the upper ferromagnetic sublayer 4a3 are preferably made of a Co—Fe alloy. That is, the first pinned magnetic layer 4a preferably has a laminated structure composed of Co—Fe/Ta/Co—Fe. In this case, the second pinned magnetic layer 4c is preferably made of a cobalt-iron-boron (Co—Fe—B) alloy or a cobalt-iron (Co—Fe) alloy. According to this structure of this embodiment, a high ratio of change in resistance (ΔR/R) can be effectively obtained while a small RA is realized.

An excessively small thickness of the lower ferromagnetic sublayer 4a1 or the upper ferromagnetic sublayer 4a3 is not preferred because reproducing characteristics are degraded. More specifically, each of the average thickness of the lower ferromagnetic sublayer 4a1 and that of the upper ferromagnetic sublayer 4a3 is in the range of about 8 to 16 Å. The total thickness of the magnetic sublayers included in the first pinned magnetic layer 4a is preferably in the range of about 16 to 32 Å.

In the embodiment shown in FIG. 1, from the bottom, the antiferromagnetic layer 3, the pinned magnetic layer 4, the insulating barrier layer 5, and the free magnetic layer 6 are sequentially laminated. Alternatively, from the bottom, the free magnetic layer 6, the insulating barrier layer 5, the pinned magnetic layer 4, and the antiferromagnetic layer 3 may be sequentially laminated. In this case, the free magnetic layer 6 having a laminated ferrimagnetic structure is formed as in the pinned magnetic layer 4 shown in FIG. 1. More specifically, the free magnetic layer 6 is formed by sequentially laminating, from the bottom, a first free magnetic layer, a nonmagnetic interlayer, and a second free magnetic layer. The first free magnetic layer is formed so as to have a laminated structure in which a nonmagnetic metal sublayer is disposed between two ferromagnetic sublayers, as in the structure shown FIG. 2. The ferromagnetic sublayers included in the first free magnetic layer are preferably made of a Ni—Fe alloy. Furthermore, an enhance layer made of a Co—Fe alloy may be provided at the interface between the second free magnetic layer and the insulating barrier layer 5.

Alternatively, the tunneling magnetoresistive element of this embodiment may be a dual tunneling magnetoresistive element in which, from the bottom, a lower antiferromagnetic layer, a lower pinned magnetic layer, a lower insulating barrier layer, a free magnetic layer, an upper insulating barrier layer, an upper pinned magnetic layer, and an upper antiferromagnetic layer are sequentially laminated.

In the case of such a dual tunneling magnetoresistive element, the lower pinned magnetic layer has the laminated ferrimagnetic structure of this embodiment, and the nonmagnetic metal sublayer shown in FIG. 2 is disposed in a first pinned magnetic layer included in the lower pinned magnetic layer. In addition, preferably, the upper pinned magnetic layer also has a structure in which a nonmagnetic metal sublayer is provided as in the lower pinned magnetic layer.

A single nonmagnetic metal sublayer 4a2 may be provided between magnetic sublayers to be interposed. Alternatively, two or more nonmagnetic metal sublayers 4a2 may be provided between magnetic sublayers.

However, as described in experimental results described below, preferably, this embodiment is applied to a structure in which, from the bottom, the antiferromagnetic layer 3, the pinned magnetic layer 4, the insulating barrier layer 5, and the free magnetic layer 6 are sequentially laminated as shown in FIGS. 1 and 2 from the standpoint that a high ratio of change in resistance (ΔR/R) can be obtained while a small RA is realized, compared with known structures.

A method of producing a tunneling magnetoresistive element of this embodiment will now be described. FIGS. 3 to 7 are partial cross-sectional views of the tunneling magnetoresistive element during production steps. FIG. 3 and FIGS. 5 to 7 show cross sections at the same position as that of the tunneling magnetoresistive element shown in FIG. 1. FIG. 4 is a partial enlarged cross-sectional view that mainly shows the laminated structure of the first pinned magnetic layer of the pinned magnetic layer of the tunneling magnetoresistive element in the step shown in FIG. 3.

Figure 3:
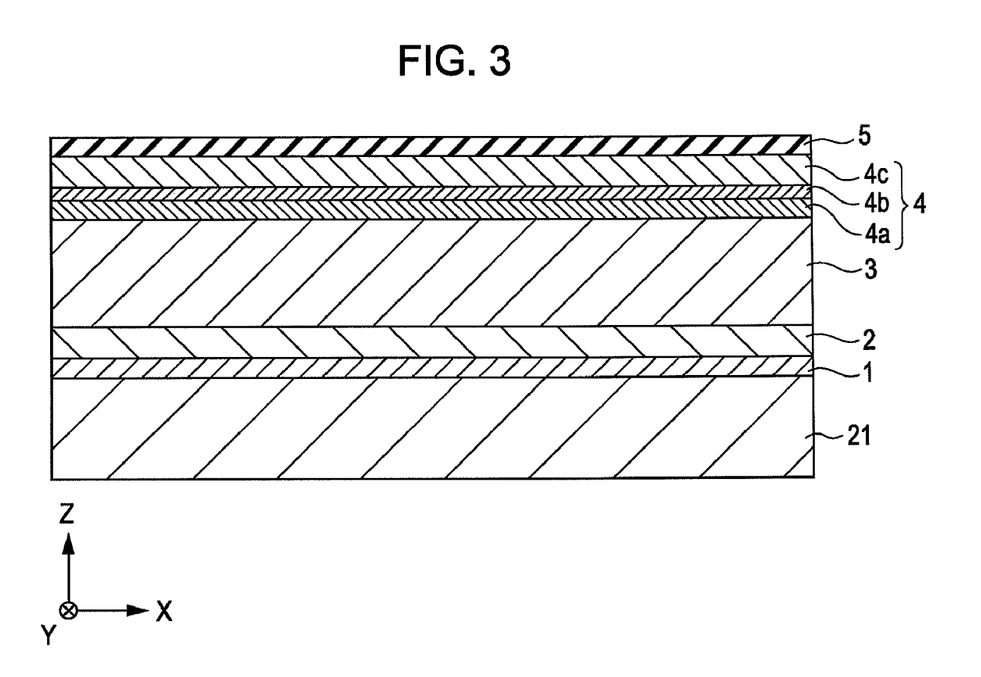
FIG. 3 is a partial cross-sectional view of a tunneling magnetoresistive element during a step in a production process.
Figure 4:
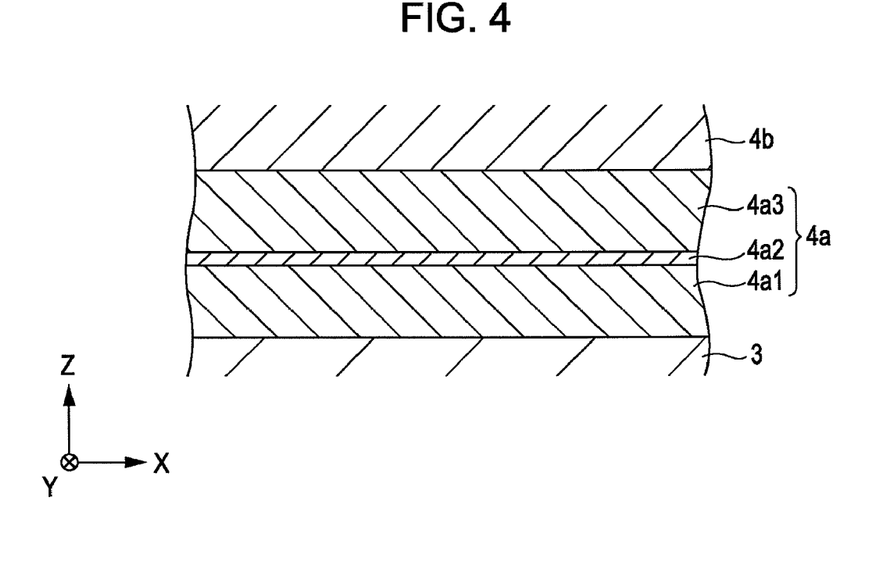
FIG. 4 is a partial enlarged cross-sectional view that mainly shows the laminated structure of a first pinned magnetic layer of the pinned magnetic layer of the tunneling magnetoresistive element in the step shown in FIG. 3.

In the step shown in FIG. 3, from the bottom, a base layer 1, a seed layer 2, an antiferromagnetic layer 3, a first pinned magnetic layer 4a, a nonmagnetic interlayer 4b, and a second pinned magnetic layer 4c are successively deposited on a lower shield layer 21.

In this embodiment, as shown in FIG. 4, in the formation of the first pinned magnetic layer 4a, a lower ferromagnetic sublayer 4a1 made of, for example, a Co—Fe alloy is deposited by sputtering so as to have a thickness of about ten to twenty angstroms. Subsequently, a nonmagnetic metal sublayer 4a2 made of, for example, Ta is deposited on the lower ferromagnetic sublayer 4a1 by sputtering so as to have an average thickness of about 1 Å or more and about 5 Å or less. An upper ferromagnetic sublayer 4a3 made of, for example, a Co—Fe alloy is then deposited on the nonmagnetic metal sublayer 4a2 by sputtering so as to have a thickness of about ten to twenty angstroms.

As shown in FIG. 3, an insulating barrier layer 5 made of magnesium oxide (Mg—O) is formed on the second pinned magnetic layer 4c. For example, a target made of Mg—O having a predetermined composition ratio is prepared, and the insulating barrier layer 5 made of Mg—O is deposited on the second pinned magnetic layer 4c by sputtering.

Figure 5:
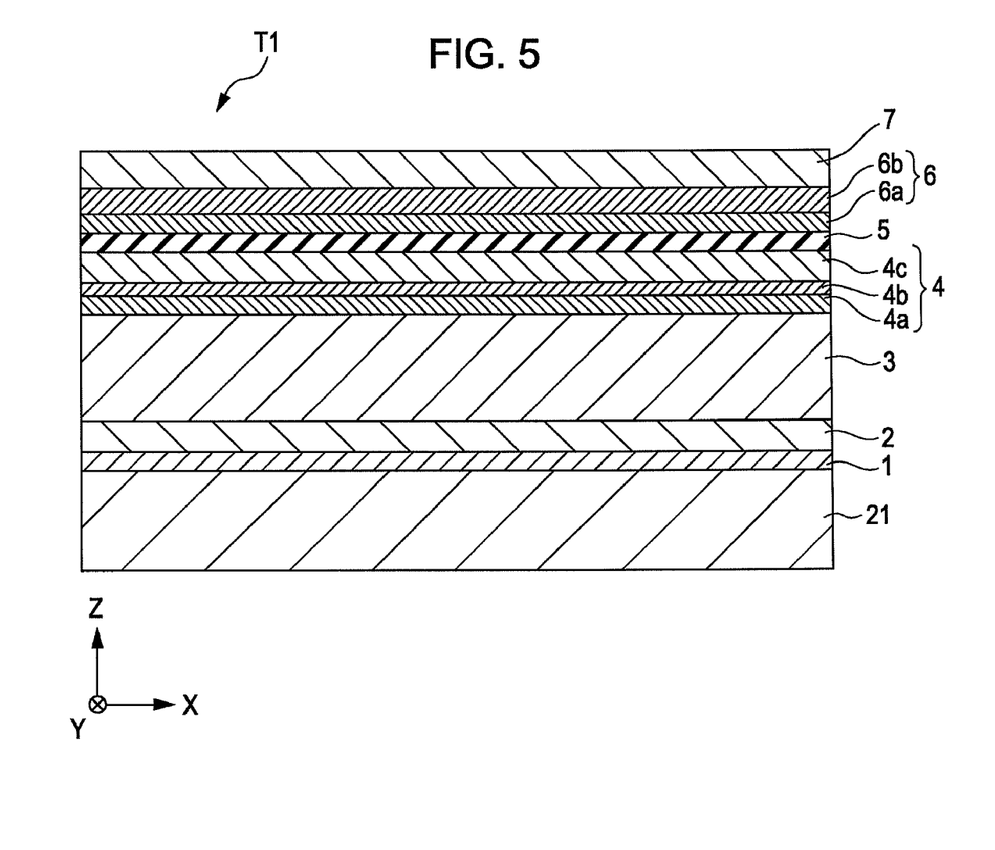
FIG. 5 is a partial cross-sectional view showing a step performed after the step shown in FIG. 3.
Figure 6:
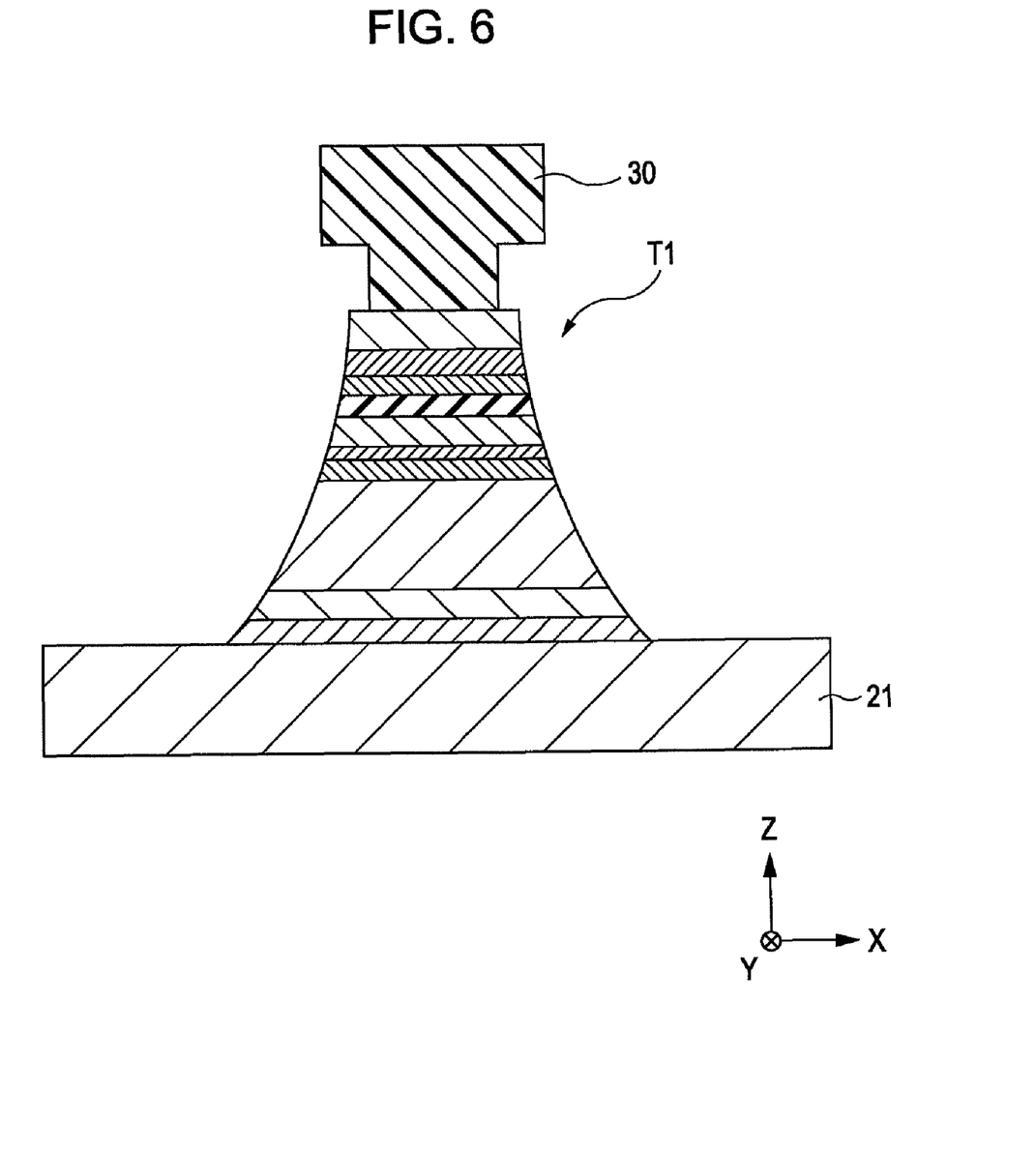
FIG. 6 is a partial cross-sectional view showing a step performed after the step shown in FIG. 5.

Next, as shown in FIG. 5, a free magnetic layer 6 including an enhance layer 6a and a soft magnetic layer 6b is deposited on the insulating barrier layer 5, and a protective layer 7 is deposited on the free magnetic layer 6. Thus, a laminate T1 in which the base layer 1 to the protective layer 7 are laminated is formed.

Subsequently, a resist layer 30 for lift-off is formed of the laminate T1. Both ends of the laminate T1 in the track width direction (the X direction in the figure), the ends not being covered with the resist layer 30 for lift-off, are removed by, for example, etching (see FIG. 6).

Figure 7:
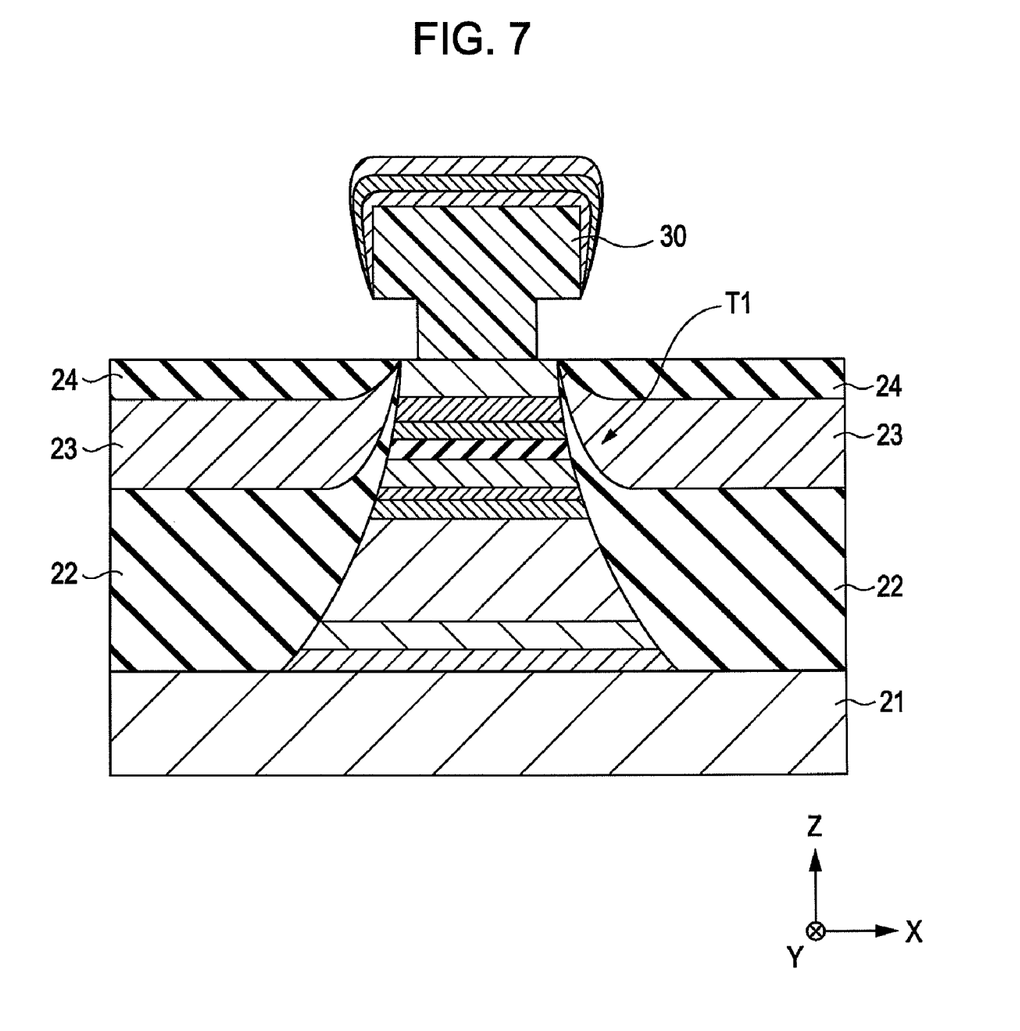
FIG. 7 is a partial cross-sectional view showing a step performed after the step shown in FIG. 6.

Next, a lower insulating layer 22, a hard bias layer 23, and an upper insulating layer 24 are laminated in that order on areas of the lower shield layer 21, the areas being disposed at both sides of the laminate T1 in the track width direction (the X direction in the figure) (see FIG. 7).

The resist layer 30 for lift-off is then removed, and an upper shield layer 26 is formed on the laminate T1 and the upper insulating layer 24.

In the above-described method of producing a tunneling magnetoresistive element, an annealing treatment is performed after the formation of the laminate T1. A typical example thereof is an annealing treatment for generating an exchange coupling magnetic field (Hex) between the antiferromagnetic layer 3 and the first pinned magnetic layer 4a. In this embodiment, it is believed that, by providing the nonmagnetic metal sublayer 4a2 made of, for example, Ta in the first pinned magnetic layer 4a, diffusion of Mn contained in the antiferromagnetic layer 3 into layers disposed on and above the nonmagnetic metal sublayer 4a2 can be appropriately suppressed.

According to this embodiment, in a tunneling magnetoresistive element including an insulating barrier layer 5 made of Mg—O, a high ratio of change in resistance ($\Delta R/R$) can be obtained while a small RA is realized, compared with known elements, by employing a simple production method in which a nonmagnetic metal sublayer 4a2 made of, for example, Ta is formed in the first pinned magnetic layer 4a.

The tunneling magnetoresistive element of this embodiment can be used not only as a magnetic head installed in a hard disk device but also as a magnetoresistive random access memory (MRAM) or a magnetic sensor.

Example 1

Tunneling magnetoresistive elements in which a nonmagnetic metal sublayer is disposed in a first pinned magnetic layer as shown in FIG. 2 were produced.

Laminates T1 were prepared by sequentially laminating the following layers from the bottom: base layer 1; Ta (30)/ seed layer 2; Ru (40)/antiferromagnetic layer 3; $Ir_{26at\%}Mn_{74at\%}$ (80)/pinned magnetic layer 4 [first pinned magnetic layer 4a/nonmagnetic interlayer 4b; Ru (9.1)/second pinned magnetic layer 4c; $\{Co_{50}Fe_{50}\}_{80at\%}B_{20at\%}$ (26)]/insulating barrier layer 5; Mg—O (10.5)/free magnetic layer 6 [$Fe_{50at\%}Co_{50at\%}$ (10)/$Ni_{87at\%}Fe_{13at\%}$ (50)]/Ru (20)/protective layer 7; Ta (180).

The insulating barrier layer 5 was deposited by sputtering using a Mg—O target.

In experiments, a plurality of tunneling magnetoresistive elements were produced. Each of the tunneling magnetoresistive elements included the first pinned magnetic layer 4a having a laminated structure of, from the bottom, $Co_{70at\%}Fe_{30at\%}$ (12)/Ta (x)/$Co_{70at\%}Fe_{30at\%}$ (12) or the first pinned magnetic layer 4a having a laminated structure of, from the bottom, $Co_{70at\%}Fe_{30at\%}$ (10)/Ta (y)/$Co_{70at\%}Fe_{30at\%}$ (10) wherein the average thicknesses (x) and (y) of the Ta sublayer were different from each other.

The numerical value in the parenthesis of each of the layers of the above laminates represents an average thickness, and the thickness is measured in angstroms (Å).

After the laminates were formed, an annealing treatment was performed at 270° C. for 3 hours and 40 minutes.

Example 2

Laminates T1 were prepared by sequentially laminating the following layers from the bottom: base layer 1; Ta (30)/ seed layer 2; Ru (40)/antiferromagnetic layer 3; $Ir_{26at\%}Mn_{74at\%}$ (80)/pinned magnetic layer 4 [first pinned magnetic layer 4a/nonmagnetic interlayer 4b; Ru (9.1)/second pinned magnetic layer 4c; $\{CO_{50}Fe_{50}\}_{80at\%}B_{20at\%}$ (26)]/insulating barrier layer 5; Mg—O/free magnetic layer 6 [$Fe_{50at\%}Co_{50at\%}$ (10)/$Ni_{87at\%}Fe_{13at\%}$ (50)]/Ru (20)/protective layer 7; Ta (180).

The insulating barrier layer 5 was deposited by sputtering using a Mg—O target.

In experiments, a plurality of tunneling magnetoresistive elements were produced. Each of the tunneling magnetoresistive elements included a first pinned magnetic layer 4a having a laminated structure of, from the bottom, $Co_{70at\%}Fe_{30at\%}$ (12)/Ta (3)/$Co_{70at\%}Fe_{30at\%}$ (12), and the average thicknesses of the Mg—O layer was varied so as to be 10.0, 10.5, or 11.0 Å.

The numerical value in the parenthesis of each of the layers of the above laminates represents an average thickness, and the thickness is measured in angstroms (Å).

After the laminates were formed, an annealing treatment was performed at 270° C. for 3 hours and 40 minutes.

COMPARATIVE EXAMPLE

Laminates T1 were prepared by sequentially laminating the following layers from the bottom: base layer 1; Ta (30)/ seed layer 2; Ru (40)/antiferromagnetic layer 3; $Ir_{26at\%}Mn_{74at\%}$ (80)/pinned magnetic layer 4 [first pinned magnetic layer 4a/nonmagnetic interlayer 4b; Ru (9.1)/second pinned magnetic layer 4c; $\{CO_{50}Fe_{50}\}_{80at\%}B_{20at\%}$ (26)]/insulating barrier layer 5; Mg—O/free magnetic layer 6 [$Fe_{50at\%}Co_{50at\%}$ (10)/$Ni_{87at\%}Fe_{13at\%}$ (50)]/Ru (20)/protective layer 7; Ta (180).

The insulating barrier layer 5 was deposited by sputtering using a Mg—O target.

In experiments, a plurality of tunneling magnetoresistive elements were produced. Each of the tunneling magnetoresistive elements included a first pinned magnetic layer 4a having a single-layer structure of $Co_{70at\%}Fe_{30at\%}$ (20), and the average thicknesses of the Mg—O layer was varied so as to be 10.0, 10.5, or 11.0 Å.

The numerical value in the parenthesis of each of the layers of the above laminates represents an average thickness, and the thickness is measured in angstroms (Å).

After the laminates were formed, an annealing treatment was performed at 270° C. for 3 hours and 40 minutes.

Figure 8:
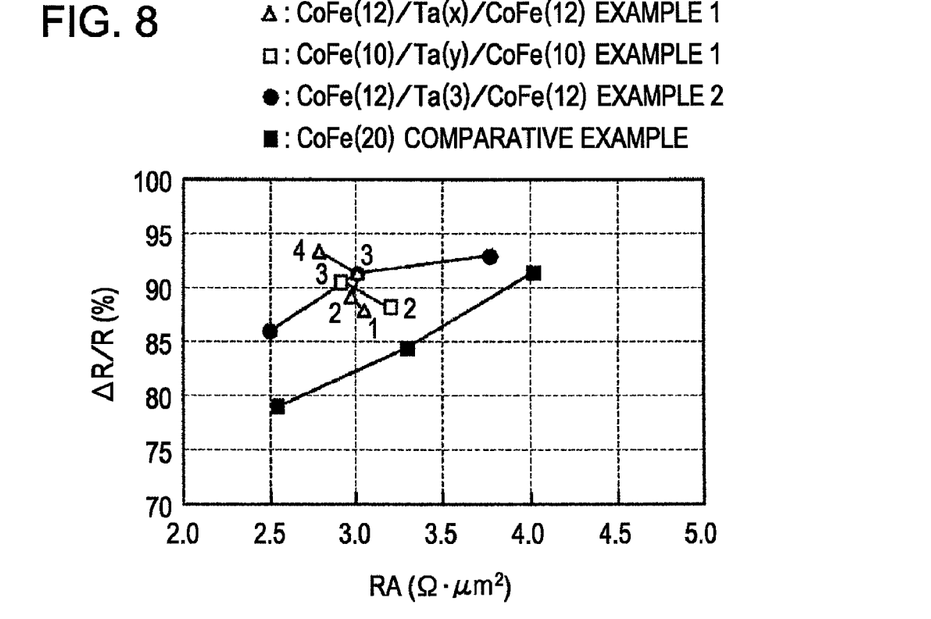
FIG. 8 is a graph showing the relationship between the value of RA and the ratio of change in resistance ($\Delta R/R$) of each of tunneling magnetoresistive elements of Example 1, Example 2, and Comparative Example.

The value of RA (element resistance R×element area A) and the ratio of change in resistance ($\Delta R/R$) of each of the tunneling magnetoresistive elements of Examples 1 and 2, and the comparative example were measured. FIG. 8 shows the experimental results. The numerical values in the graph each represent the average thickness (Å) of the Ta sublayer.

As shown in FIG. 8, in the tunneling magnetoresistive elements of the examples, high ratios of change in resistance ($\Delta R/R$) could be achieved within a range where the value of RA was small, as compared with the tunneling magnetoresistive elements of the comparative example.

The value of RA is preferably in the range of 1.0 to 5.0 $\Omega \cdot \mu m^2$. Comparing the ratios of change in resistance ($\Delta R/R$) of the examples with those of the comparative example within this range of RA, the results showed that the ratios of change in resistance ($\Delta R/R$) of the tunneling magnetoresistive elements of the examples could be reliably higher than the ratios of change in resistance ($\Delta R/R$) of the tunneling magnetoresistive elements of the comparative example.

In addition, the results showed that the value of RA was not significantly changed even when the average thickness of the Ta sublayer was varied.

Figure 9:
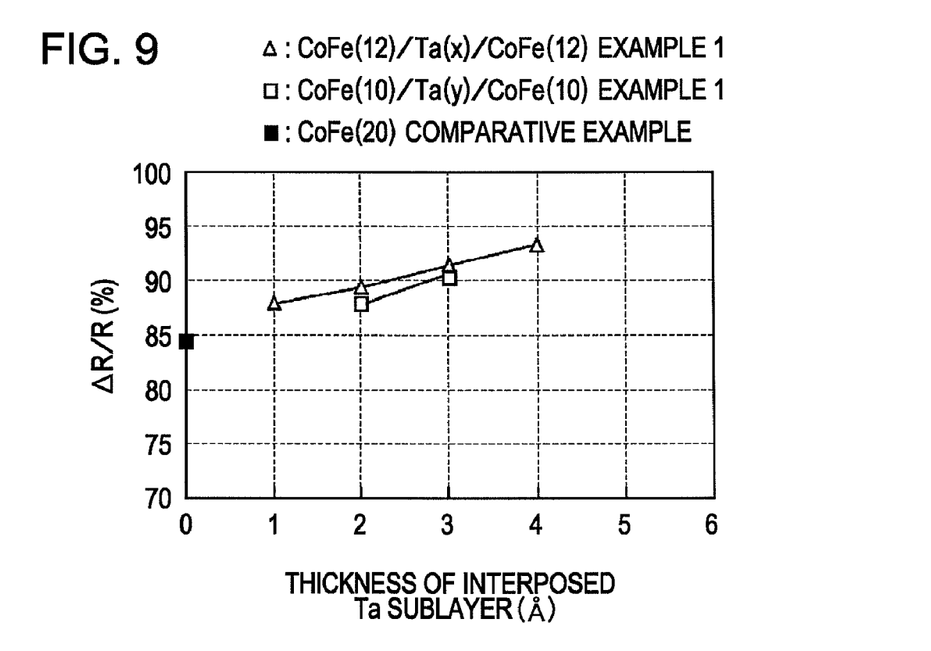
FIG. 9 is a graph showing the relationship between the average thickness of a tantalum (Ta) sublayer (nonmagnetic metal sublayer) and the ratio of change in resistance ($\Delta R/R$).

FIG. 9 is a graph plotted on the basis of the experimental results of the ratio of change in resistance ($\Delta R/R$) in the tunneling magnetoresistive elements of Example 1. In FIG. 9, the horizontal axis represents the average thickness of the Ta sublayer, and the vertical axis represents the ratio of change in resistance ($\Delta R/R$). A point of the comparative example is also shown in FIG. 9. This point represents an experimental result of a tunneling magnetoresistive element including an insulating barrier layer having the same thickness as that of the tunneling magnetoresistive elements of Example 1.

As shown in FIG. 9, as the average thickness of the Ta sublayer increased, the ratio of change in resistance ($\Delta R/R$) gradually increased. On the basis of the experimental results shown in FIG. 9, a preferable range of the average thickness of the nonmagnetic metal sublayer 4a2 was determined to be 1 Å or more and 5 Å or less. When the average thickness of the nonmagnetic metal sublayer 4a2 is more than 5 Å, a ferromagnetic coupling that acts between the lower ferromagnetic sublayer 4a1 and the upper ferromagnetic sublayer 4a3 is weakened, and a problem such as a decrease in the ratio of change in resistance ($\Delta R/R$) occurs instead. A more preferable range of the average thickness of the nonmagnetic metal sublayer 4a2 was determined to be 2 Å or more and 4 Å or less.

What is claimed is:

1. A tunneling magnetoresistive element comprising:
   a lower magnetic layer;
   an insulating barrier layer laminated on the lower magnetic layer; and
   an upper magnetic layer laminated on the insulating barrier layer;
   wherein one of the lower magnetic layer and the upper magnetic layer is a pinned magnetic layer in which the magnetization direction is pinned and the other is a free magnetic layer in which the magnetization direction is changed in response to an external magnetic field,
   the insulating barrier layer is made of magnesium oxide (Mg—O),
   the lower magnetic layer has a laminated ferrimagnetic structure in which, from the bottom, a first magnetic layer, a nonmagnetic interlayer, and a second magnetic layer are laminated in that order,
   the first magnetic layer has a laminated structure in which at least one nonmagnetic metal sublayer is interposed between ferromagnetic sublayers, the ferromagnetic sublayers are magnetically coupled to each other, and all the ferromagnetic sublayers are magnetized in the same direction and
   the nonmagnetic metal sublayer has an average thickness of about 1 Å or more and about 5 Å or less.

2. The tunneling magnetoresistive element according to claim 1, wherein the nonmagnetic metal sublayer comprises at least one of titanium (Ti), vanadium (V), zirconium (Zr), niobium (Nb), molybdenum (Mo), hafnium (Hf), tantalum (Ta), and tungsten (W).

3. The tunneling magnetoresistive element according to claim 2, wherein the nonmagnetic metal sublayer comprises tantalum (Ta).

4. The tunneling magnetoresistive element according to claim 1, wherein the lower magnetic layer is the pinned magnetic layer and the upper magnetic layer is the free magnetic layer.

5. The tunneling magnetoresistive element according to claim 4, wherein the ferromagnetic sublayers comprise a cobalt-iron (Co—Fe) alloy, the nonmagnetic metal sublayer comprises tantalum (Ta), and the first magnetic layer has a laminated structure comprising Co—Fe/Ta/Co—Fe.

* * * * *